United States Patent
Carron et al.

(10) Patent No.: US 7,972,911 B1
(45) Date of Patent: Jul. 5, 2011

(54) METHOD FOR FORMING METALLIC MATERIALS COMPRISING SEMI-CONDUCTORS

(75) Inventors: Veronique Carron, Claix (FR); Fabrice Nemouchi, Moirans (FR)

(73) Assignee: Commissariat A l'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 12/965,030

(22) Filed: Dec. 10, 2010

(30) Foreign Application Priority Data

Dec. 10, 2009 (FR) ..................... 09 05976

(51) Int. Cl.
*H01L 21/00* (2006.01)
*H01L 21/84* (2006.01)
*H01L 21/44* (2006.01)
*H01L 21/302* (2006.01)
*H01L 21/461* (2006.01)

(52) U.S. Cl. .................. 438/162; 438/655; 438/754
(58) Field of Classification Search ............ 438/162, 438/655, 754; 257/E29.262
See application file for complete search history.

(56) References Cited

U.S. PATENT DOCUMENTS

| | | | |
|---|---|---|---|
| 5,288,666 A | 2/1994 | Lee | |
| 6,150,248 A | 11/2000 | Sekiguchi et al. | |
| 2003/0162349 A1 | 8/2003 | Wieczorek et al. | |
| 2005/0136584 A1 | 6/2005 | Boyanov et al. | |
| 2007/0032025 A1 | 2/2007 | Brunco et al. | |
| 2009/0004850 A1 | 1/2009 | Ganguli et al. | |
| 2010/0258857 A1* | 10/2010 | Ramaswamy et al. | 257/329 |

* cited by examiner

*Primary Examiner* — William M. Brewster
(74) *Attorney, Agent, or Firm* — Oliff & Berridge, PLC

(57) ABSTRACT

The method for forming first and second metal-based materials comprises providing a substrate comprising an area made from a first semi-conductor material and an area made from a second semi-conductor material comprising germanium separated by a pattern made from dielectric material, depositing a metal layer and performing a first heat treatment in an atmosphere comprising a quantity of oxygen comprised between 0.01% and 5%. The metal layer reacts with the first semi-conductor material and the second semi-conductor material comprising germanium to respectively form the first metal-based material and the second metal-based material containing germanium.

7 Claims, 3 Drawing Sheets

METHOD FOR FORMING METALLIC MATERIALS COMPRISING SEMI-CONDUCTORS

BACKGROUND OF THE INVENTION

The invention relates to a method for forming first and second metal-based materials in a semi-conductor device.

STATE OF THE ART

Continuous improvement of the performances of integrated circuits, for example in terms of consumption and/or operating frequency, is ineluctably leading to a constant reduction of the size of their components. In order to produce devices with better and better performances, new architectures and new materials have been integrated in transistors.

However, reducing the dimensions of the transistor leads to an increase of its access resistances, which has the effect of reducing the quantity of usable current, therefore degrading its performances. To reduce the access resistances of the transistor as much as possible, the contact areas made of semi-conductor material are transformed into an intermetallic compound having a metallic behavior. This intermetallic compound, hereafter referred to as metallic material, has to be less and less resistive. In conventional manner, this metallic material, generally a silicide, is obtained by making a metal react with the semi-conductor material, in this instance the silicon of the contact areas. Titanium silicides ($TiSi_2$) or cobalt silicides ($CoSi_2$), which are conventionally used, are being replaced by silicides which present better technical characteristics, for example Nickel silicides (NiSi). Nickel silicides present in fact a lower resistivity, a reduced silicon consumption and a lower formation temperature.

In parallel, germanium is replacing silicon in transistors, or is associated therewith to improve the electric performances of silicon. Indeed, the mobility of the charge carriers, the holes in particular, being higher in germanium than in silicon, germanium is particularly interesting for high-frequency applications which require a high supply current. It is therefore important to master formation of a metallic material from a semi-conductor material containing germanium.

In the presence of germanium, nickel is the most frequently used metal on account of the low temperatures required to form the intermetallic compounds $NiSi_{1-X}Ge_X$ and NiGe. However, whereas nickel is the main diffusing species during growth of nickel silicides and germanides, there is also a large diffusion of germanium when growing germanide, in particular along the insulation areas of the transistor made from dielectric material.

FIGS. 1 and 2 represent growth of nickel germanide and silicide on a substrate 1 in conventional manner.

As illustrated in FIG. 1, a nickel layer 2 is deposited simultaneously on a silicon area 3, a germanium area 4 and insulation patterns 5 made from dielectric material, which surround and electrically separate the adjacent areas 3 and 4 made from semi-conductor materials (Si and/or Ge).

FIG. 2 represents the assembly after it has been subjected to an heat treatment which has made nickel layer 2 react with the silicon of area 3 and with the germanium of area 4 to respectively form a nickel silicide 6 and a nickel germanide 7.

On account of the large diffusion of germanium in the nickel layer, this method has the following consequences:

formation of nickel germanide 7 on dielectric patterns 5 which gives rise to short-circuits, formation of cavities 8 in the germanium layer located immediately underneath nickel germanide 7, coming from transportation of germanium to nickel germanide 7.

Formation of a nickel germanide on dielectric patterns 5 is indicative of lateral growth of nickel germanide 7. This growth is observed indifferently for germanium layers located at a higher level and at a lower level than that of patterns 5.

In order to reduce the problems arising from diffusion of germanium, a method for forming a self-aligned nickel germanide has been proposed in the document US20070032025. This document describes forming a nickel layer on germanium areas and performing a first heat treatment in an inert atmosphere at a temperature comprised between 150° C. and 325° C. During this first heat treatment, the nickel layer reacts with the germanium layer to form nickel germanide. The thermal budget of this step is chosen so as to enable the reaction between the nickel and germanium while at the same time limiting diffusion of the germanium atoms. Formation of a nickel germanide above the dielectric material areas is therefore limited. The nickel that did not react with the germanium is then removed and a second heat treatment is performed. The temperature of this second heat treatment is higher, between 325° C. and 400° C., so as to convert the previously formed nickel-rich germanide into a mononickel germanide (NiGe) that is less resistive than the other forms of nickel germanide.

Thus, by means of two consecutive heat treatments within very strict temperature ranges, a self-aligned mononickel germanide NiGe can be formed. However this approach is very difficult to master in the case of co-integration of nickel silicide and nickel germanide. The thermal budget necessary for formation of a nickel silicide is in fact higher than the thermal budget necessary for formation of a nickel germanide. The first thermal budget required for the nickel germanide thereby forms a nickel silicide which is very rich in nickel. This nickel silicide is too rich in nickel and the unreacted nickel cannot be removed selectively with respect to this silicide. This results in a nickel silicide layer that is discontinuous.

This method is therefore not usable for performing co-integration of nickel silicide and nickel germanide from a substrate comprising semi-conductor areas containing silicon and semi-conductor areas containing germanium.

OBJECT OF THE INVENTION

The object of the invention is to provide a method for forming metal-based materials that is simple and easy to implement, without any risks of short-circuits between these materials.

More particularly, the object of the invention is to provide a method wherein the thermal budget is compatible with co-integration of a metallic material comprising silicon and a metallic material comprising germanium.

According to the invention, we tend to achieve these objectives by providing a substrate comprising an area made from a first semi-conductor material and an area made from a second material semi-conductor comprising germanium separated by a pattern made from dielectric material, by depositing a metal layer and performing a first heat treatment. The metal layer reacts at least partially with the first semi-conductor material and the second semi-conductor material comprising germanium to respectively form the first metal-based material and the second metal-based material containing germanium. First heat treatment is performed in an atmosphere comprising a quantity of oxygen comprised between 0.01% and 5%.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
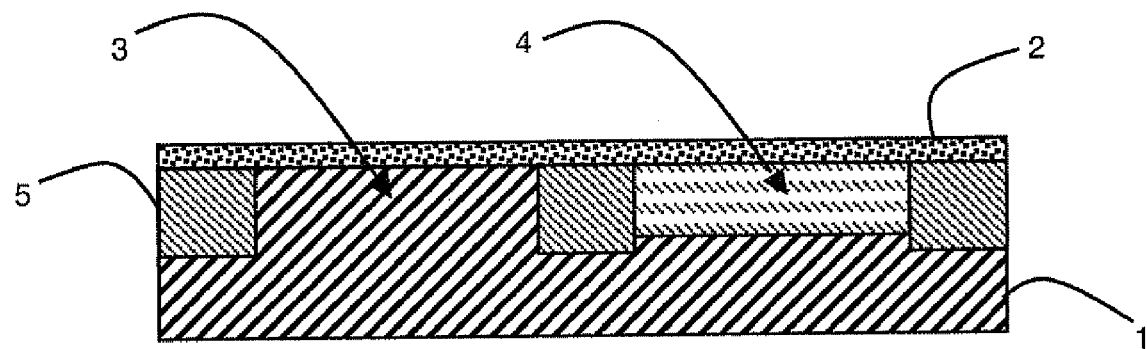
FIGS. 1 and 2 schematically represent, in cross-section, steps of a method for forming metal-based materials according to the prior art.
Figure 2:
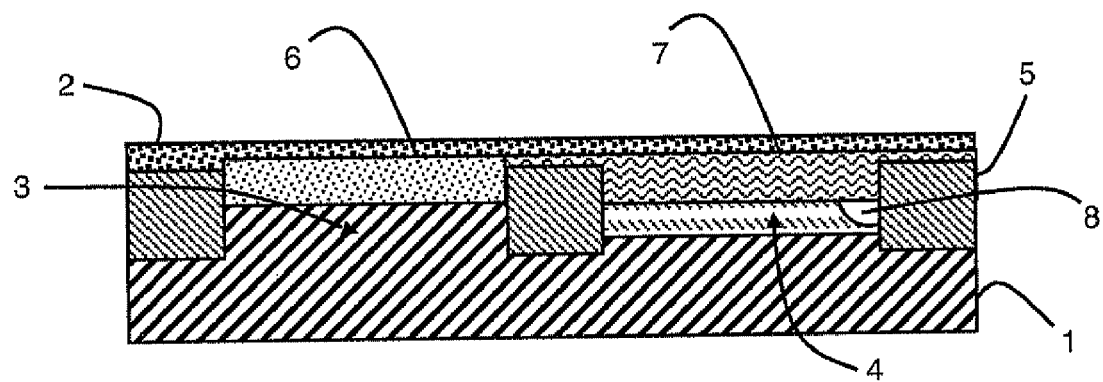

FIG. 1 constitutes a starting point of the method according to the invention. A surface of a substrate 1 comprises an area 3 made from first semi-conductor material and an area 4 made from second semi-conductor material. In conventional manner, substrate 1 comprises a plurality of areas made from semi-conductor materials. In the case of co-integration, the substrate comprises an area 3 of semi-conductor material containing silicon and an area 4 of semi-conductor material containing germanium. According to an alternative embodiment, all of the areas can be made exclusively from semi-conductor material containing germanium.

In the case of co-integration, the first semi-conductor material preferably comprises germanium. The first semi-conductor material is for example a silicon-germanium alloy $Si_{1-X}Ge_X$ with an atomic percentage (x) of germanium, also called germanium content, greater than or equal to 30% ($x \geq 0.3$), or pure germanium Ge. The second semi-conductor material preferably comprises silicon. The second material semi-conductor is for example a silicon-germanium $Si_{1-X}Ge_X$ alloy with a maximum germanium concentration of 30% ($x \leq 0.3$), or pure silicon Si. The first and second semi-conductors material can be doped or intrinsic.

In conventional manner, areas 3 and 4 are separated by a pattern 5 made from insulating dielectric material. In this way, the pattern prevents any diffusion of material between these two areas. Areas 3 and 4 form for example a gate electrode made from SiGe and source and drain electrodes made from Si or vice-versa. In this case, dielectric material pattern 5 is formed by the gate dielectric and the spacers which delineate the gate electrode. As illustrated in FIG. 1, areas 3 and 4 are for example active areas made from silicon and germanium. Pattern 5 is then a lateral electric insulation pattern which separates the active areas.

Substrate 1 generally comprises a plurality of patterns 5 made from dielectric material between the active areas. These patterns 5 are made from conventional materials of the microelectronics industry, for example from silicon oxide $SiO_2$, silicon nitride $Si_3N_4$ or a dielectric material with a high dielectric constant, $HfO_2$, $Al_2O_3$ etc.

Figure 3:
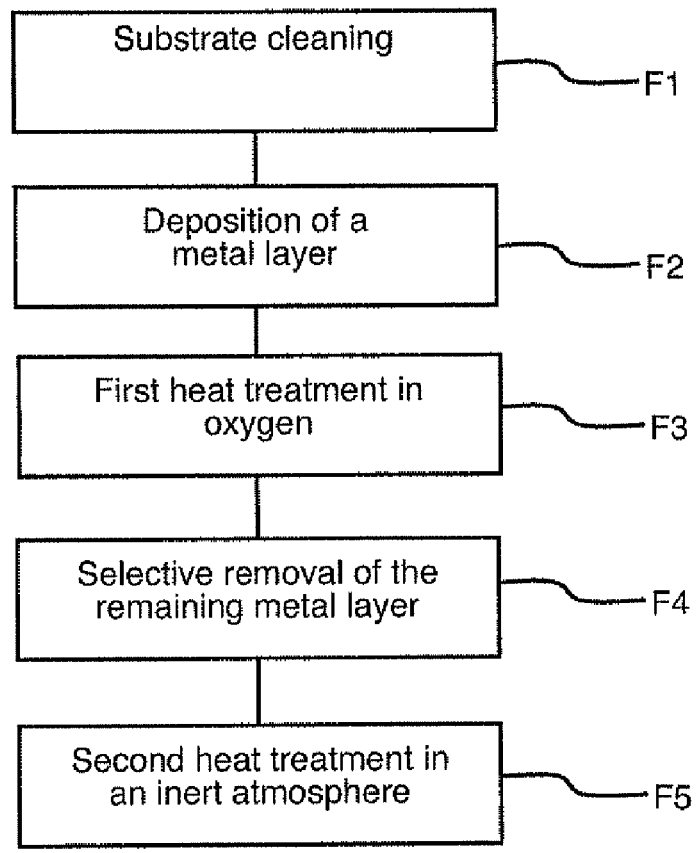
FIG. 3 represents, in flowchart form, steps of a method for forming metal-based materials according to the invention, FIGS. 4 and 5 schematically represent, in cross-section, steps of the method of FIG. 3.
Figure 4:
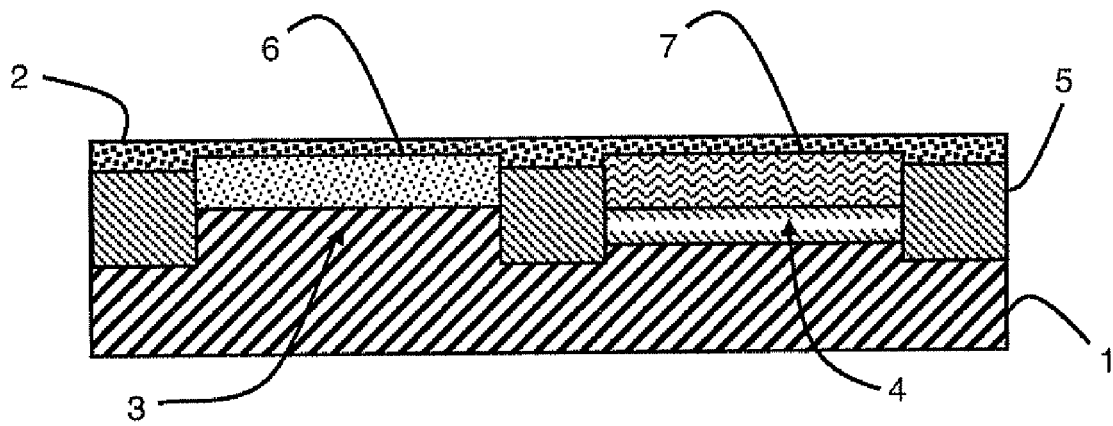
Figure 5:
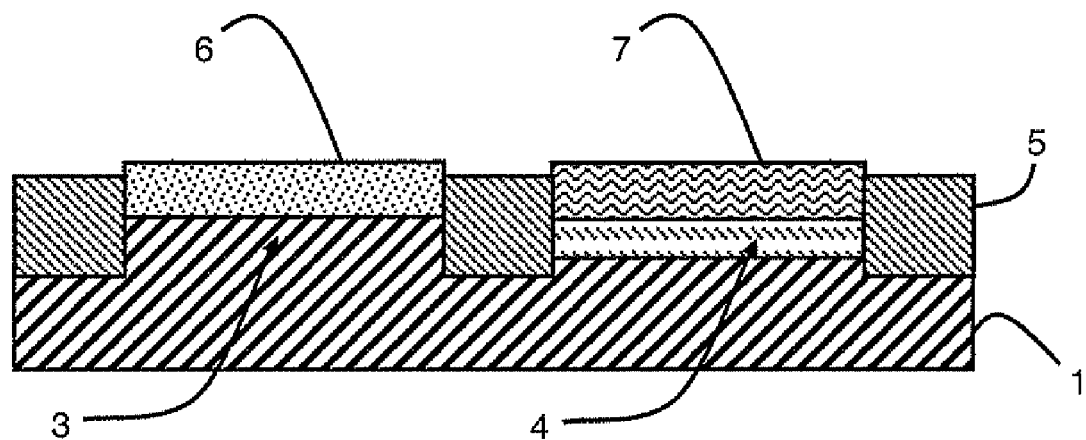

FIGS. 3 to 5 illustrate steps of a method for forming metal-based materials from semi-conductors.

In FIG. 3, a cleaning step F1 is firstly performed on substrate 1 to eliminate the impurities and native oxides that are present at the surface, in particular on areas 3 and 4. Cleaning is performed in conventional manner for example by means of wet etching and/or by plasma etching. Cleaning can for example comprise treatment with hydrofluoric acid and/or an argon plasma.

A metal layer 2 is then deposited on areas 3, 4 and pattern 5 during a step F2. The metal layer is preferably nickel-based and deposited on the whole surface of substrate 1. Nickel-based layer 2 is deposited, in conventional manner, by any suitable technique that enables deposition at a sufficiently low temperature to prevent uncontrolled formation of a germanide or a silicide. The deposition temperature is preferably chosen lower than or equal to 100° C. Deposition of layer 2 is performed for example by chemical vapor deposition, by sputtering, by physical vapor deposition or by electron beam evaporation.

Layer 2 is for example a layer of pure nickel. Layer 2 can also contain a majority of nickel, the nickel content being greater than or equal to 50% weight, and an alloy element. The alloy element is preferably platinum, palladium, or a mixture of these materials. Adding an alloy element in layer 2 in particular enables the temperature stability range of the germanides and silicides to be increased. The thickness of nickel-based layer 2 is comprised between 1 nm and 100 nm, preferably between 5 nm and 20 nm.

A first heat treatment, noted F3 in FIG. 3, is then performed to at least partially transform semi-conductor areas 3 and 4 in contact with metal layer 2 respectively into metal-based materials 6 and 7 (FIG. 4). What is meant by metal-based material is a metallic material, i.e. a material having an electric behavior of metallic type, and comprising a semi-conductor. Thus, when the first heat treatment is performed, layer 2 reacts with semi-conductor material area 3 containing silicon and semi-conductor material area 4 containing germanium to respectively form a metallic material 6 containing silicon and a metallic material 7 containing germanium.

This first heat treatment can be performed by means of a rapid heat treatment, for example lamp-based rapid thermal annealing or spike annealing.

The first heat treatment is performed under a controlled atmosphere comprising a blocking element in gaseous form. The blocking element is preferably oxygen. The oxygen in the annealing atmosphere enables formation of germanide 7 above area 4 but blocks diffusion of germanium along dielectric areas 5 preventing formation of a germanide 7 above these areas 5.

The quantity of oxygen is preferably sufficiently large to prevent lateral diffusion or exo-diffusion of the germanium atoms coming from the semi-conductor material of area 4. However, the oxygen content is preferably sufficiently low to not block the volume reaction between the nickel atoms and the germanium atoms in area 4, nor block the volume reaction of the nickel in the silicon in areas 3 and/or 4 (when area 4 is made from SiGe for example).

Furthermore, the oxygen content is preferably sufficiently low to not significantly modify the formation conditions of the metallic materials comprising silicon and germanium, nor significantly modify the final electrical properties of these metallic materials 6 and 7.

In particular, depending on the oxygen content in the annealing atmosphere, the first heat treatment will form oxides. The quantity of oxygen has to be sufficiently low to not totally oxidize metal layer 2 and initiate oxidation of the semi-conductor materials, in particular the silicon of area 3.

The quantity of oxygen in the atmosphere of the first heat treatment is less than 5% and more than 0.01%. This value corresponds to the volume percentage of gaseous oxygen in the annealing atmosphere. It is preferably comprised between 0.01% and 0.5%. The quantity of oxygen is for example about 0.1%. A small quantity of oxygen is then sufficient to block exo-diffusion of the germanium atoms at the periphery of area 4 and to prevent excessive oxidation of nickel-based layer 2.

If layer 2 is made from pure nickel and if areas 3 and 4 are respectively made from pure silicon and pure germanium, when the first heat treatment is performed, area 3 reacts to form a nickel silicide 6 and area 4 reacts to form a nickel germanide 7. During this heat treatment, the oxygen reacts with the germanium to prevent diffusion above dielectric material patterns 5.

Furthermore, according to the conditions of the heat treatment (duration, temperature), metallic materials 6 and 7 can present different metallurgical properties. The conditions of the first heat treatment are preferably chosen so as to obtain the least possible resistive metallic materials 6 and 7. It is therefore desired to obtain nickel monosilicide (NiSi) and mononickel germanide. In like manner, if the semi-conductor material containing germanium is a silicon-germanium alloy, the desired metallic material preferably comprises as many nickel atoms as semi-conductor atoms (Si and Ge).

If the conditions of the first heat treatment enable formation of the desired phases of metallic materials 6 and 7, the duration and temperature of the heat treatment are sufficiently low to prevent dewetting of metallic material layers 6 and 7. Dewetting of these layers results in an agglomeration of the layer. A discontinuity of the interface between the metallic material (6, 7) and the semi-conductor material of areas 3 and 4 of substrate 1 then exists, which is detrimental to the quality of the electric contact.

The temperature stability range of metallic materials 6 and 7 can be improved by adding platinum (Pt) or palladium (Pd) in nickel-based layer 2, as described in the foregoing. The dewetting phenomenon will then be attenuated.

The first heat treatment is performed at a temperature comprised between 200° C. and 600° C. in the case of a substrate formed exclusively with a semi-conductor comprising germanium, with a germanium content greater than or equal to 30%. In the case of co-integration of metallic materials comprising silicon and germanium, the first heat treatment is performed at a temperature comprised between 350° C. and 500° C.

For a nickel-based layer 2 with a thickness of 1 nm to 100 nm, the duration of the first heat treatment varies between 10 seconds and 200 seconds. The thickness of layer 2 preferably varying between 5 nm and 20 nm, the duration varies between 30 seconds and 2 minutes.

Depending on the heat treatment conditions and on the thickness of the nickel-based layer, the reaction kinetics of the nickel with the silicon and germanium are such that a part of the metallic layer may not have reacted. It is then possible for the reaction to be complete or partial for the first and second semi-conductor materials, or to be complete for one of the two materials and partial for the other of the two materials. However, in all cases, after the first heat treatment in an atmosphere containing oxygen, the germanium of area 4 has not diffused to metal 2 above dielectric patterns 5 to form germanide above these patterns.

As illustrated in FIGS. 3 and 4, on completion of this first heat treatment, the method comprises a step F4 of removal of the remaining metal layer 2 that did not react with the semi-conductor material containing silicon and the semi-conductor material containing germanium. This remaining layer is then removed selectively with respect to the dielectric material forming patterns 5 and metallic materials 6 and 7 (FIG. 5). This selective removal is performed in conventional manner, for example by bringing substrate 1 into contact with a chemical solution of suitable composition.

For example purposes, aqueous solutions enabling selective etching, with respect to a nickel silicide, of a layer mainly composed of nickel are based on a halogenide acid, for example hydrochloric acid ($HCl/H_2O$ mixture), hydrofluoric acid ($HF/H_2O$ mixture) or hydrobromic acid ($HBr/H_2O$ mixture). These solutions may contain sulfuric acid $H_2SO_4$ or phosphoric acid $H_3PO_4$. The document US20070032025 describes numerous examples of chemical solutions that can be used for selective removal by aqueous means.

When the first heat treatment is performed, metal layer 2 can be partly oxidized on the surface depending on the oxygen content used. The oxide formed cannot be removed and then disturbs the removal step of the remaining layer 2. The oxide formed at the surface does in fact protect the metal in depth from etching. A judiciously chosen oxygen content enables a trade-off between a reduced oxidation of the metal layer and sufficient prevention of diffusion of the germanium atoms above patterns 5.

If the conditions of the first heat treatment do not enable metallic materials 6 and 7 with the desired electric characteristics to be obtained, the conditions of the first heat treatment are chosen so as to obtain metallic materials 6 and 7 rich in nickel, i.e. that comprise more nickel atoms than Si and/or Ge atoms.

If after the first heat treatment, at least one of metallic materials 6 and 7 presents a nickel-rich composition, i.e. if $Ni_XA_Y$ with X>Y and A=Si and/or Ge, then a second heat treatment can be performed in a step F5 (FIG. 3). The object of this second heat treatment is to transform nickel-rich metallic materials 6 and 7 into metallic materials having an equal nickel and semi-conductor material (Si or Ge) composition and which presents a lower resistivity. Nickel monosilicides NiSi and nickel monogermanides NiGe are sought by means of the second heat treatment.

This second heat treatment can be performed with the same techniques as the first heat treatment, i.e. by means of rapid heat treatment, for example lamp-based rapid annealing or spike annealing. This second heat treatment is performed in an inert controlled atmosphere, for example in argon or nitrogen.

The second heat treatment is optional in the case of a substrate formed with a semi-conductor exclusively comprising germanium. The temperature of the first heat treatment can be in fact sufficient to form the germanide in the desired phase. It may on the other hand be necessary, in the case of a substrate with a semi-conductor comprising silicon, to finalize formation of nickel monosilicide.

In general manner, the temperature of the second heat treatment is higher than that of the first heat treatment. The second heat treatment is performed at a temperature comprised between 400° C. and 600° C.

For a nickel-based layer 2 with a thickness of 1 nm to 100 nm, the duration of the second heat treatment varies between 10 seconds and 200 seconds. The thickness of layer 2 preferably varying between 5 nm and 20 nm, the duration varies between 30 seconds and 2 minutes.

For example, a nickel layer having a thickness of 30 nm is deposited (FIG. 3; F2) on the silicon and germanium areas. A first lamp-based thermal treatment (F3) for 2 minutes at 350° C. is then performed in oxygen at a concentration of 0.1%. Under these conditions, a mononickel germanide NiGe 7 is formed directly in area 4. During this first heat treatment, silicon area 3 forms a nickel silicide 6. If the nickel silicide is a mixture of nickel monosilicide NiSi and nickel disilicide $Ni_2Si$, a second heat treatment is performed to transform nickel disilicide $Ni_2Si$ into nickel monosilicide NiSi. The thermal budget of this second heat treatment is then chosen so that the previously formed mononickel germanide NiGe is not degraded, in particular by dewetting. In conventional manner, before the second heat treatment is performed, the unreacted nickel is removed selectively with respect to metallic materials 6 and 7 present on the substrate. Selective removal of unreacted nickel is performed for example by means of a HCl/H2O mixture of volume proportion 1/10 at 55° C. for 4 minutes.

If the semi-conductor material of area 4 is a silicon-germanium alloy, metallic material 7 is also containing silicon-germanium alloy. Furthermore, if nickel-based layer 2 contains other metallic elements able to react with silicon and germanium, for example cobalt or platinum, then metallic materials 6 and 7 obtained are mixtures of these metals. For example purposes, silicon can react with layer 2 to form a silicide which mainly contains a nickel silicide.

The method described can be used with any semi-conductor containing germanium. It is particularly interesting for simultaneous formation of a metallic material containing silicon and a metallic material containing germanium. This co-integration, silicide/germanide for example, is made possible by the fact that the temperature of the first heat treatment is sufficiently high to form a first nickel silicide which will remain intact when the remaining nickel-based layer is removed.

This same temperature is moreover sufficient to form the required germanide in a single step whereas two anneals are necessary in the prior art.

The invention claimed is:

1. Method for forming first and second metal-based materials in a semi-conductor device comprising the following steps:

providing a substrate comprising an area made from a first semi-conductor material and an area made from a second semi-conductor material comprising germanium separated by a pattern made from dielectric material, depositing a metal layer, performing a first heat treatment in an atmosphere comprising a quantity of oxygen comprised between 0.01% and 5%, the metal layer reacting at least partially with the first semi-conductor material and the second semi-conductor material comprising germanium to respectively form the first metal-based material and the second metal-based material containing germanium.

2. The method according to claim 1, wherein the metal layer is nickel-based.

3. The method according to claim 1, wherein the first semi-conductor material comprises silicon and the second semi-conductor material comprises germanium, with a percentage of germanium greater than or equal to 30%.

4. The method according to claim 1, comprising removal of the metal layer that did not react during the first heat treatment.

5. The method according to claim 1, wherein the metal layer contains an alloy element.

6. The method according to claim 5, wherein the alloy element is chosen from platinum or palladium.

7. The method according to claim 1, comprising a second heat treatment to reduce the resistivity of at least one of the first and second metal-based materials.

\* \* \* \* \*